United States Patent
Chen et al.

(10) Patent No.: US 9,312,230 B2
(45) Date of Patent: Apr. 12, 2016

(54) CONDUCTIVE PILLAR STRUCTURE FOR SEMICONDUCTOR SUBSTRATE AND METHOD OF MANUFACTURE

(75) Inventors: Chih-Hua Chen, Jhubei (TW); Chen-Shien Chen, Zhubei (TW); Chen-Cheng Kuo, Chu-Pei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 1176 days.

(21) Appl. No.: 12/701,868

(22) Filed: Feb. 8, 2010

(65) Prior Publication Data
US 2011/0193232 A1 Aug. 11, 2011

(51) Int. Cl.
*H01L 23/00* (2006.01)
*H01L 23/31* (2006.01)

(52) U.S. Cl.
CPC ............ *H01L 24/13* (2013.01); *H01L 23/3192* (2013.01); *H01L 24/05* (2013.01); *H01L 2224/0345* (2013.01); *H01L 2224/0361* (2013.01); *H01L 2224/0391* (2013.01); *H01L 2224/0401* (2013.01); *H01L 2224/05567* (2013.01); *H01L 2224/05624* (2013.01); *H01L 2224/05647* (2013.01); *H01L 2224/1147* (2013.01); *H01L 2224/11462* (2013.01); *H01L 2224/13147* (2013.01); *H01L 2224/81801* (2013.01); *H01L 2224/81895* (2013.01); *H01L 2924/0002* (2013.01); *H01L 2924/014* (2013.01); *H01L 2924/01013* (2013.01); *H01L 2924/01019* (2013.01); *H01L 2924/01029* (2013.01); *H01L 2924/01032* (2013.01); *H01L 2924/01033* (2013.01); *H01L 2924/01049* (2013.01); *H01L 2924/01082* (2013.01); *H01L 2924/10329* (2013.01); *H01L 2924/14* (2013.01); *H01L 2924/19041* (2013.01)

(58) Field of Classification Search
CPC ....................................................... H01L 23/48
See application file for complete search history.

(56) References Cited

U.S. PATENT DOCUMENTS

| 6,559,548 | B1 * | 5/2003 | Matsunaga et al. ........... 257/774 |
| 2010/0109158 | A1 * | 5/2010 | Platz et al. ................... 257/737 |

FOREIGN PATENT DOCUMENTS

| CN | 1879213 | 12/2006 |
| TW | 200504974 | 2/2005 |
| TW | 200531610 | 9/2005 |

OTHER PUBLICATIONS

Office Action dated May 2, 2012 from corresponding No. CN 201110035254.3.
Office Action dated Jul. 22, 2013 from corresponding No. TW 100103911.

* cited by examiner

*Primary Examiner* — Marvin Payen
(74) *Attorney, Agent, or Firm* — Hauptman Ham, LLP

(57) ABSTRACT

A conductive pillar structure for a die includes a passivation layer having a metal contact opening over a substrate. A bond pad has a first portion inside the metal contact opening and a second portion overlying the passivation layer. The second portion of the bond pad has a first width. A buffer layer over the bond pad has a pillar contact opening with a second width to expose a portion of the bond pad. A conductive pillar has a first portion inside the pillar contact opening and a second portion over the buffer layer. The second portion of the conductive pillar has a third width. A ratio of the second width to the first width is between about 0.35 and about 0.65. A ratio of the second width to the third width is between about 0.35 and about 0.65.

22 Claims, 6 Drawing Sheets

CONDUCTIVE PILLAR STRUCTURE FOR SEMICONDUCTOR SUBSTRATE AND METHOD OF MANUFACTURE

TECHNICAL FIELD

The disclosure relates generally to semiconductor bump processes, and more particularly to a structure and methods for forming conductive pillar bump structures.

BACKGROUND

Flip chip technology plays an important role in the packaging of semiconductor devices. A flip chip microelectronic assembly includes a direct electrical connection of face down electronic components onto substrates, such as circuit boards, using solder bumps as the interconnects. The use of flip chip packaging has dramatically grown as a result of the flip chips advantages in size, performance and flexibility over other packaging methods.

Recently, conductive pillar technology has been developed. Instead of using solder bumps, electronic components are connected to substrates by means of copper pillars. The copper pillar technology achieves a finer pitch with a lower probability of bump bridging, reduces the capacitance load of the circuits and allows the electronic components to perform at higher frequencies.

However, the standard pillar manufacture processes have a number of shortcomings. For example, standard conductive pillar manufacturing processes can create stress in the microelectronic assembly leading to cracks. The cracks may propagate to the underlying electronic components in the chip. The cracks can damage or destroy the electronic components thereby increasing the failure rate of the overall assembly.

Accordingly, there is a need for an improved structure and method to form conductive pillar for a semiconductor wafer with robust electrical performance.

SUMMARY

An embodiment of the disclosure includes a semiconductor die including a conductive pillar. A substrate is provided. A passivation layer has a metal contact opening over the substrate. A bond pad has a first portion inside the metal contact opening and a second portion overlying the passivation layer. The second portion of the bond pad has a first width. A buffer layer is disposed over the bond pad. The buffer layer has a pillar contact opening with a second width to expose a portion of the bond pad. A conductive pillar has a first portion inside the pillar contact opening and a second portion over the buffer layer. The second portion of the conductive pillar has a third width. A ratio of the second width to the first width is between about 0.35 and about 0.65. A ratio of the second width to the third width is between about 0.35 and about 0.65.

Another embodiment of the disclosure includes a semiconductor die including a conductive pillar. A substrate is provided. A first passivation layer has a metal contact opening over the substrate. A bond pad has a first portion and a second portion. The first portion is inside the metal contact opening. A second portion overlies the first passivation layer and has a first width. A second passivation layer overlies the first passivation layer, partially covers the bond pad and leaves a bond pad surface exposed. A buffer layer overlies the second passivation layer and a part of the second portion of the bond pad. The buffer layer has a pillar contact opening with a second width over a part of the exposed surface of the bond pad. A first conductive pillar has a first portion and a second portion. The first portion is inside the pillar contact opening of the buffer layer. The second portion above the first portion has a third width. A ratio of the second width of the first width is between about 0.35 and about 0.65. A ratio of the second width to the third width is between about 0.35 and about 0.65.

Yet another embodiment of the disclosure includes a method of forming a conductive pillar. A substrate is provided. A passivation layer is formed over the substrate. The passivation layer has a metal contact opening. A bond pad is formed over the passivation layer. The bond pad has a first portion disposed inside the metal contact opening and a second portion with a first width above the first portion. An buffer layer is formed overlying the bond pad, the buffer layer having a pillar contact opening with a second width to partially expose the second portion of the bond pad. A conductive pillar is formed to cover the opening and overlie a portion of the buffer layer and the conductive pillar has a third width. A ratio of the second width to the first width is between 0.35 to about 0.65. A ratio of the second width to the third width is between about 0.35 and about 0.65.

Various embodiments of the present invention may be used to moderate the shortcomings of the standard pillar manufacturing processes. For example, the various embodiments may reduce stress created in the assembly process and reduce crack propagation that can reduce yield.

BRIEF DESCRIPTION OF THE DRAWINGS

The disclosure will be described with reference to embodiments thereof as illustrated in the accompanying figures. It should be understood that the drawings are for illustrative purposes and are therefore not drawn to scale.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative of specific ways to make and use the invention, and do not limit the scope of the invention.

FIGS. 1 to 7 are cross-sectional views for fabricating conductive pillars to a substrate at various stages according to one embodiment of this invention. FIG. 8 depicts a flow chart of a method 200 for fabricating conductive pillars. The term "substrate" as described herein, generally refers to a semiconductor substrate on which various layers and integrated circuits are formed. The substrate may include silicon or compound semiconductor, such as GaAs, InP, Si/Ge, or SiC. Examples of layers may include dielectric layers, doped layers, metal layers, polysilicon layers and via plugs that may connect one layer to one or more layers. Examples of integrated circuits may include transistors, resistors, and/or capacitors.

Figure 1:
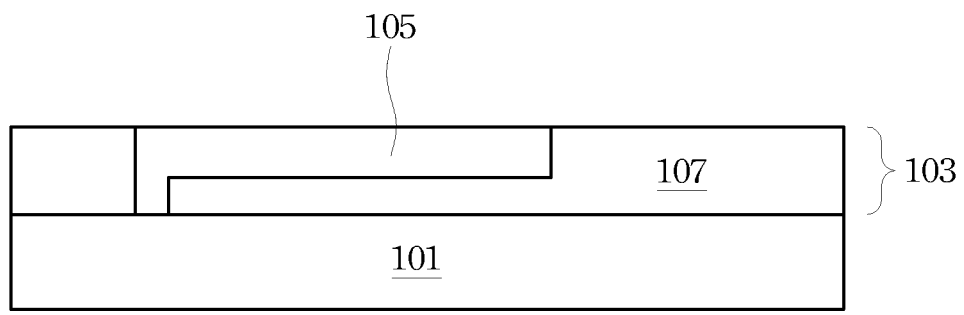
FIG. 1 shows a cross-sectional view of the semiconductor substrate.

Referring to FIG. 1 and FIG. 8, in process step 201, a substrate 101 is provided. An interconnect layers 103 is formed on the surface of the substrate 101. The interconnect layers 103 include one or more layers of conductive layers 105 disposed within one or more layers of dielectric layers 107. The conductive layers 105 are formed over integrated circuits to make electrical connections from the integrated circuits to the upper layers. The dielectric layer 107 may be formed, for example, of low-k dielectric materials with dielectric constants (k value) between about 2.9 and 3.8, ultra low-k (ULK) dielectric materials with k values between about 2.5 and about 2.9, some combination of low-k dielectric materials, or the like. With the decrease in k value, the dielectric layers 107 become more fragile and become subject to delamination and cracking.

Figure 2:
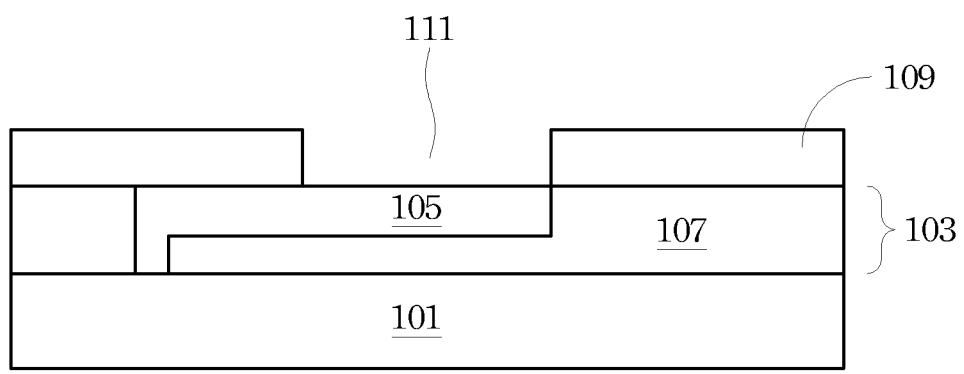
FIG. 2 shows a first passivation layer with a metal contact opening formed over the surface of the substrate in FIG. 1.

Referring to FIG. 2 and FIG. 8, in process step 202, a first passivation layer 109 is formed over the interconnect layers 103 to protect the integrated circuits and interconnect layers 103 from damage and contamination. A metal contact opening 111 is formed to expose a portion of the surface of conductive layer 105. In one embodiment, the formation process of the metal contact opening 111 includes depositing the first passivation layer 109 over the interconnect layer 103, and etching to define the metal contact opening 111. The first passivation layer 109 may be one or more layers and include of a material such as, for example oxide, undoped silicate glass (USG), silicon nitride (SiN), silicon dioxide (SiO2) or silicon oxynitride (SiON). The passivation layer 109 may have a thickness of between about 0.6 μm and about 1.4 μm. The first passivation layer 109 prevents or decreases moisture, mechanical, and radiation damage to the integrated circuits.

Figure 3:
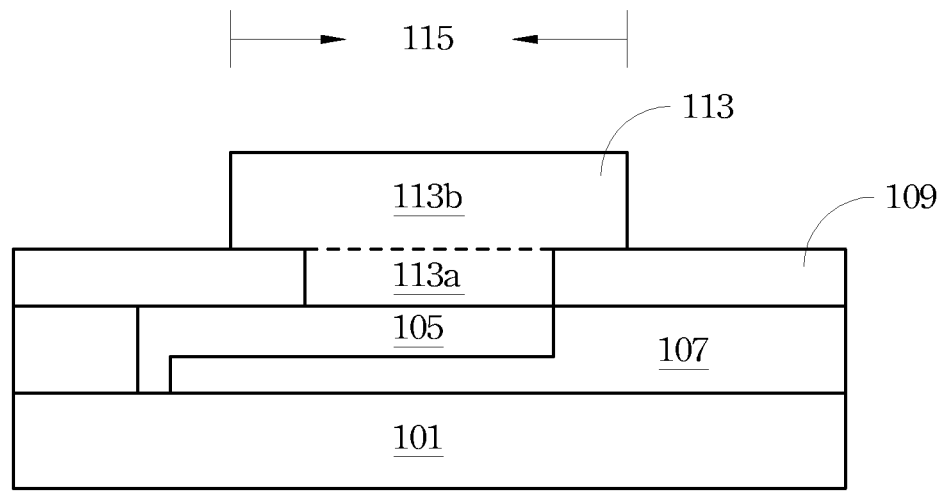
FIG. 3 shows a bond pad is formed over the first passivation layer.

Referring to FIG. 3 and FIG. 8, in process step 203, a bond pad 113 is formed over the first passivation layer 109. The bond pad 113 has a first portion 113a inside the metal contact opening 111 and a second portion 113b overlies the first passivation layer 109. The second portion 113b has a width 115. The bond pad 113 contacts the conductive layer 105 and provides electrical connection to the underlying integrated circuits. In one embodiment, the bond pad 113 may include an electrically conductive material such as aluminum, aluminum alloy, copper, copper alloy, or combinations thereof. The bond pad 113 can be deposited by physical vapor deposition (PVD) such as a sputtering deposition using a sputtering target made of aluminum, copper or an alloy thereof followed by defining the deposited layer for the bond pad 113 with photolithography and etching.

Figure 4:
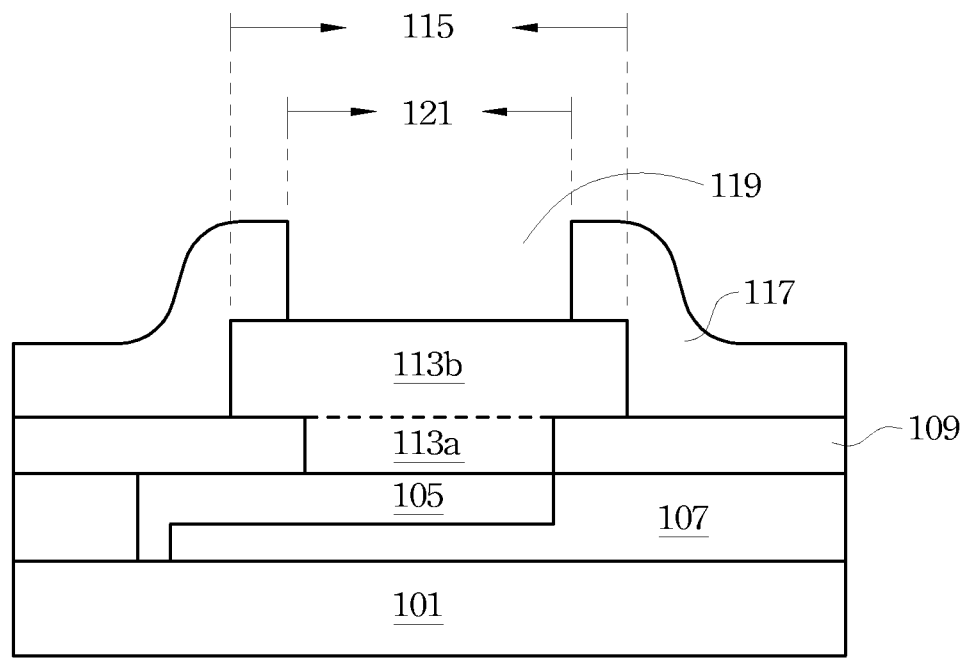
FIG. 4 shows a second passivation layer formed over the first passivation layer and cover a portion of the bond pad.

Referring to FIG. 4 and FIG. 8, in process step 204, a second passivation layer 117 is formed over the first passivation layer 109 and the bond pad 113. The second passivation layer 117 may be formed in a similar fashion and from similar materials as the first passivation layer 109. Alternatively, the first passivation layer 109 and second passivation layer 117 may be formed from materials different from each other. The second passivation layer 117 may be deposited over the first passivation layer 109 and the bond pad 113 by conventional deposition techniques, such as chemical vapor deposition (CVD). Photolithography and etching follow the deposition to selectively define an opening 119 on the bond pad 113. The second passivation layer 117 partially covers the bond pad 113 and leaves a surface of the bond pad 113 in the opening 119 exposed. The opening 119 has a width 121, which is substantially smaller than the width 115. The second passivation layer 117 absorbs or releases thermal or mechanical stress caused by packaging of the substrate.

Figure 5:
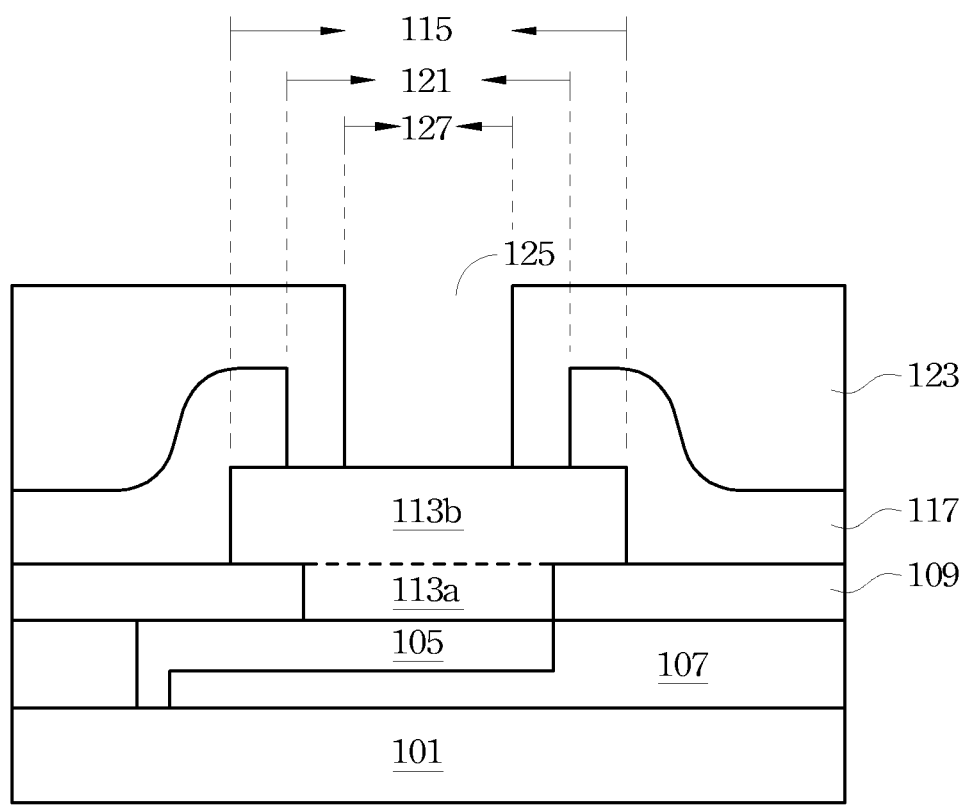
FIG. 5 shows a buffer layer formed over the second passivation layer and cover a portion of the bond pad.

Referring to FIG. 5 and FIG. 8, in process step 205, a buffer layer 123 is formed over the second passivation layer 117 and the bond pad 113. The buffer layer 123 includes polyimide, PBO or epoxy, to a thickness of between about 2 μm and about 10 μm. The buffer layer 123 coats on the second passivation layer 117 and fills into the opening 119 to cover the exposed surface of the second portion 114 of the bond pad 113. The buffer layer 123 serves as a stress buffer to reduce the stress transfer to the first passivation layer 109 and the second passivation layer 117 during assembly process. Photolithography and patterning follow to selectively define a pillar contact opening 125 on the bond pad 113. The pillar contact opening 125 has a width 127 over a part of the exposed surface of the bond pad 113.

Figure 6:
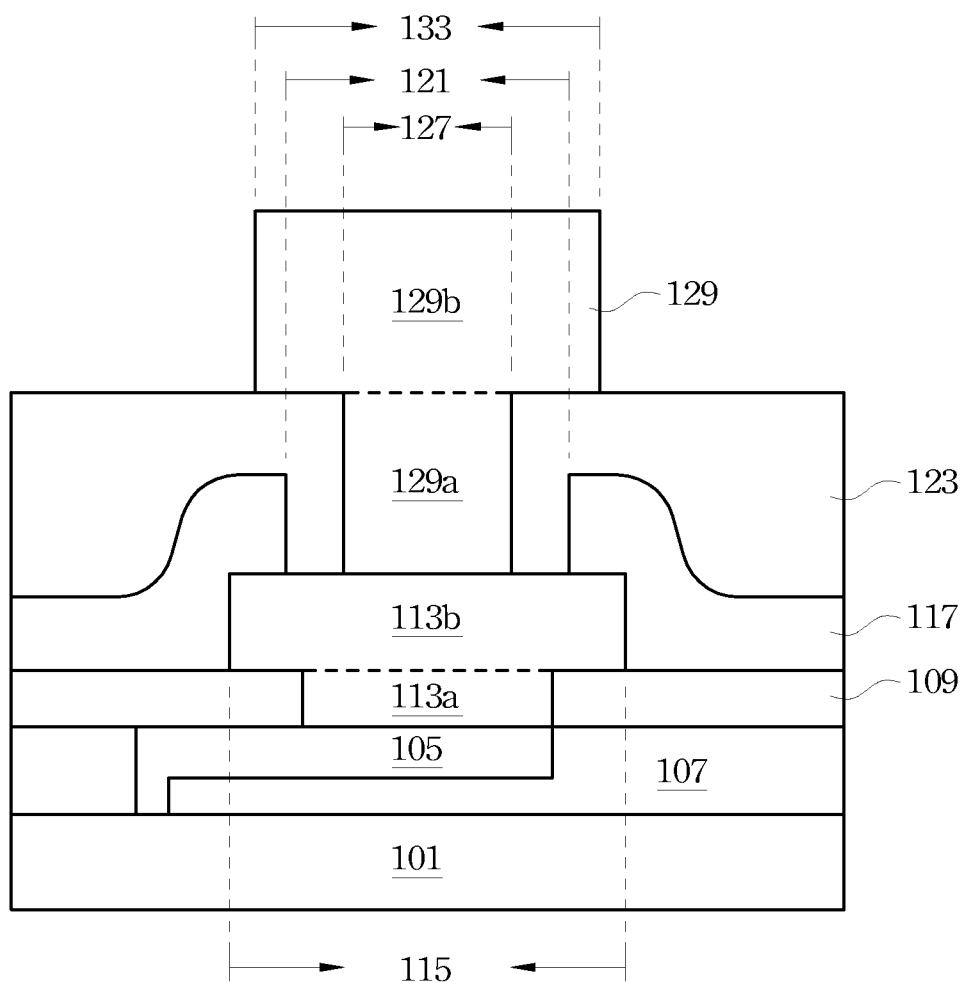
FIG. 6 shows a conductive pillar formed over the buffer layer.

Referring to FIG. 6 and FIG. 8, in process step 206, a conductive pillar 129 is formed over the buffer layer 123. The conductive pillar 129 has a first portion 129a inside the pillar contact opening 125 and a second portion 129b overlying the buffer layer 109. The second portion 131 has a width 133. The width 133 is from about 55 μm to about 130 μm. The conductive pillar 129 may have a height from about 35 μm to about 55 μm from the bottom of the first portion 129a. The conductive pillar 129 electrically contacts the interconnect layer 103 through the bond pad 113 and provide electrical connection to the underlying integrated circuits. In one embodiment, the conductive pillar 129 may include an electrically conductive material such as copper or copper alloy. The conductive pillar 129 can be formed by electroplating to fill out the opening of a patterned photoresist layer (not shown) above the buffer layer 123. The photoresist layer is removed after the electroplating process. Multiple conductive pillars (not shown) are formed on the buffer layer 123. A pitch is defined between two conductive pillars and the pitch is about 125 μm to about 250 μm.

An acceptable yield of assembly is related to two ratios. A first ratio is width 127 to width 115. A second ratio is width 127 to width 133. The first ratio of width 127 to width 115 is between about 0.35 and about 0.65. The second ratio of width 127 to width 133 is between about 0.35 and about 0.65. For example, If the ratio is lower than 0.35, the failure rate of assembly could rise. When the width 127 is small, there is a higher chance for a bad contact between the conductive pillar 129 and the bond pad 113. If the ratio is higher than 0.65, the second passivation layer 117 could crack during assembly process. For example, when the width 127 is large, the buffer layer 123 may not be able to reduce the stress transfer to bond pad 113 during assembly process. Then, the stress would spread from bond pad 113 to the second passivation layer 117. The fragile second passivation layer 117 may become subject to delamination and cracking.

Figure 7:
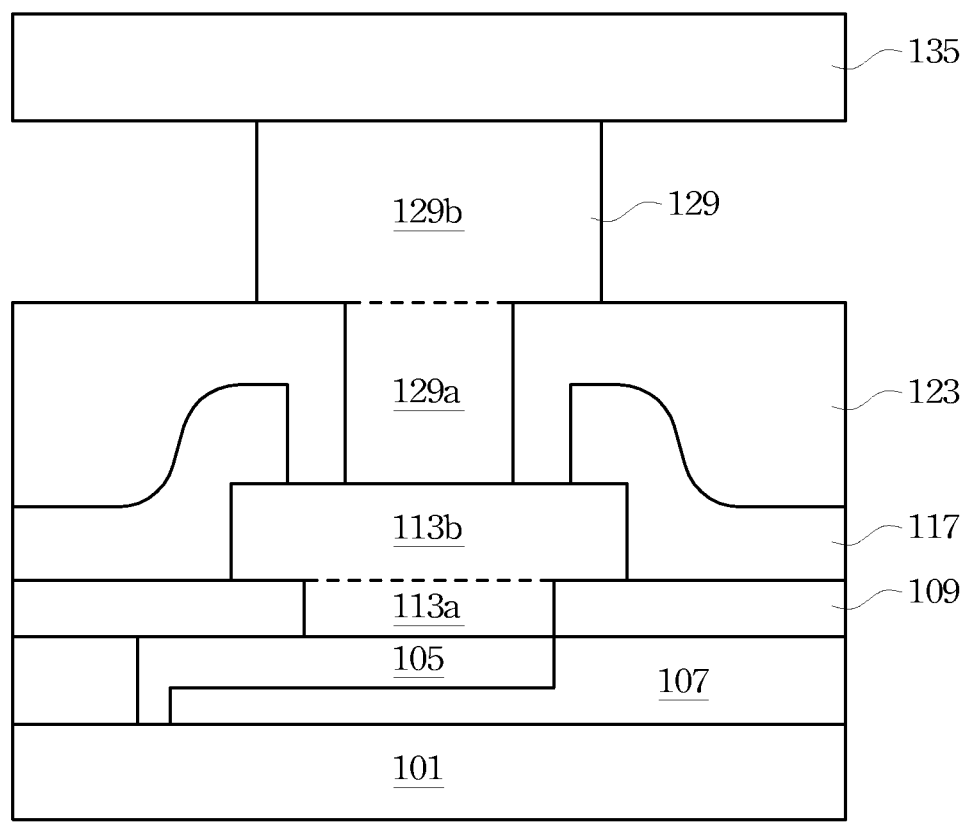
FIG. 7 shows the semiconductor substrate bonded to a semiconductor component.
Figure 8:
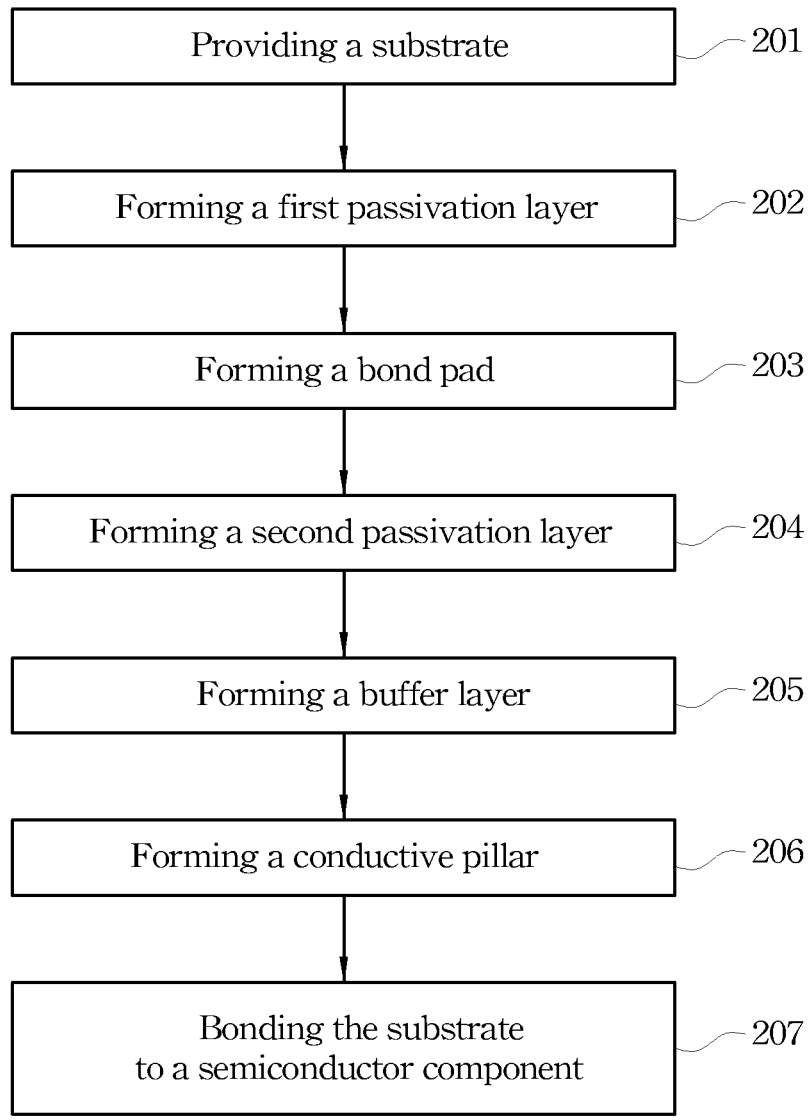
FIG. 8 shows a flow chart of a method for fabricating conductive pillars.

Referring to FIG. 7 and FIG. 8, in process step 207, the semiconductor substrate 101 is bonded to a semiconductor component 135 using the conductive pillar 129 shown in FIG. 6. In one embodiment, the semiconductor component 135 may be a semiconductor chip, carrier substrate, circuit board or any suitable component familiar to those skilled in the art. The semiconductor substrate 101 and the semiconductor component 135 could be electrically connected through the conductive pillar 129. The bonding methods include copper-to-copper bonding, solder bonding or any suitable method familiar to those skilled in the art.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor die comprising:
    a substrate;
    a passivation layer having a metal contact opening over the substrate;
    a bond pad having a first portion inside the metal contact opening and a second portion overlying the passivation layer, the second portion of the bond pad having a first width;
    a buffer layer disposed over the bond pad, the buffer layer having a pillar contact opening with a second width to expose a portion of the bond pad; and
    a conductive pillar having a first portion inside the pillar contact opening and a second portion disposed over the buffer layer, the second portion of the conductive pillar having a third width, wherein a ratio of the second width to the first width is between about 0.35 and about 0.65, and a second ratio of the second width to the third width is between about 0.35 and about 0.65.

2. The semiconductor die of claim 1, further comprising an interconnect layer formed over the semiconductor substrate and under the passivation layer.

3. The semiconductor die of claim 2, wherein the conductive pillar is electrically connected to the interconnect layer through the bond pad.

4. The semiconductor die of claim 1, wherein the passivation layer includes at least one selected from the group consisting of oxide, undoped silicate glass (USG), silicon nitride and silicon oxynitride.

5. The semiconductor die of claim 1, wherein the buffer layer comprises polyimide.

6. The semiconductor die of claim 1, wherein the conductive pillar comprises copper or copper alloy.

7. A semiconductor die comprising:
    a substrate;
    a first passivation layer having a metal contact opening over the substrate;
    a bond pad having a first portion and a second portion, the first portion inside the metal contact opening, the second portion overlying the first passivation layer and having a first width;
    a second passivation layer overlying the first passivation layer, partially covering second portion of the bond pad and leaving a surface of the bond pad exposed;
    a buffer layer overlying the second passivaton layer and a part of the second portion of the bond pad, the buffer layer having a pillar contact opening with a second width over a part of the exposed surface of the bond pad; and
    a conductive pillar having a first portion and a second portion, the first portion inside the pillar contact opening of the buffer layer, the second portion above the first portion having a third width,
    wherein a ratio of the second width to the first width is between about 0.35 and about 0.65 and a second ratio of the second width to the third width is between about 0.35 and about 0.65.

8. The semiconductor die of claim 7, wherein the second passivation layer has an opening with a fourth width to expose the second bond pad, the fourth width is substantially wider than the third width.

9. The semiconductor die of claim 7, wherein the third width is from about 55 μm to about 130 μm.

10. The semiconductor die of claim 7, wherein the passivation layer includes at least one selected from the group consisting of oxide, undoped silicate glass (USG), silicon nitride and silicon oxynitride.

11. The semiconductor die of claim 7, wherein the buffer layer comprises polyimide.

12. The semiconductor die of claim 7, further comprising multiple said conductive pillars each being in a respective pillar contact opening over a respective bond pad, a pitch defined between adjacent conductive pillars being from about 125 μm to about 250 μm.

13. A method of forming a conductive pillar structure, said method comprising:
    forming a passivation layer over the substrate, the passivation layer having a metal contact opening;
    forming a bond pad over the passivation layer, the bond pad having a first portion inside the metal contact opening and a second portion with a first width above of the first portion;
    forming a buffer layer overlying the bond pad, the buffer layer having a pillar contact opening with a second width to partially expose the second portion of the bond pad; and
    forming a conductive pillar in the pillar contact opening and overlying a portion of the buffer layer, wherein the conductive pillar overlying the buffer layer has a third width,
    wherein a ratio of the second width to the first width is between about 0.35 to about 0.65,
    and a second ratio of the second width to the third width is between about 0.35 and about 0.65.

14. The method of claim 13, further comprising:
    forming a second passivation layer overlying the first passivation layer, partially covering the second portion of the bond pad and leaving a surface of the second portion of the bond pad exposed.

15. The method of claim 14, wherein the second passivation layer has an opening with a fourth width to expose the second portion of the bond pad, the fourth width is narrower than the third width.

16. The method of claim 13, wherein the passivation layer includes at least one selected from the group consisting of oxide, undoped silicon glass (USG), silicon nitride and silicon oxynitride.

17. The method of claim 13, wherein the buffer layer comprises polyimide.

18. The method of claim 13, wherein the conductive pillar comprises copper or copper alloy.

19. The method of claim 13, further comprising forming multiple said conductive pillars each being in a respective pillar contact opening over a respective bond pad at a pitch defined between adjacent conductive pillars being from about 125 μm to about 250 μm.

20. The method of claim 13, wherein the conductive pillar is formed to be electrically contacted to an interconnect layer through the bond pad.

21. The semiconductor die of claim 4, wherein the passivation layer includes undoped silicate glass (USG).

22. The semiconductor die of claim 4, wherein the passivation layer includes silicon oxynitride.

\* \* \* \* \*